United States Patent [19]
Büttner et al.

[11] Patent Number: 5,798,975
[45] Date of Patent: Aug. 25, 1998

[54] RESTORE FUNCTION FOR MEMORY CELLS USING NEGATIVE BITLINE-SELECTION

[75] Inventors: Stefan Büttner, Sindelfingen; Jürgen Pille, Stuttgart; Dieter Wendel, Schönaich; Friedrich Wernicke, Holzgerlingen, all of Germany

[73] Assignee: International Business Machines Corporation, Armonk, N.Y.

[21] Appl. No.: 782,204

[22] Filed: Jan. 10, 1997

[51] Int. Cl.[6] ............................................. G11C 13/00
[52] U.S. Cl. ......................... 365/203; 365/189.01; 365/222
[58] Field of Search ............................... 365/203, 222, 365/189.01, 189.03, 230.01

[56] References Cited

U.S. PATENT DOCUMENTS 5,487,044  1/1996  Kawaguchi et al. ............ 365/203
5,499,218  3/1996  Ahn et al. ....................... 365/203

Primary Examiner—Terrell W. Fears
Attorney, Agent, or Firm—Lynn L. Augspurger

[57] ABSTRACT

A new method is indicated for the restore of bitlines and data-lines from memory-cells. All bit- and datalines are switched together during the restore activity so that all restore-FETs can be prepared with the necessary re-charging current. The non-addressed bitlines are then switched off through their bitswitches. In this manner, the dimensions of the re-charging devices can be considerably reduced.

8 Claims, 7 Drawing Sheets

RESTORE FUNCTION FOR MEMORY CELLS USING NEGATIVE BITLINE-SELECTION

The invention relates to a procedure and also to equipment for writing to and/or reading from at least one memory-cell of a memory-cell array such that the write and/or read lines are brought to an output potential during a restore-phase. The invention relates in particular to an improved method for executing this restore function.

In the methods indicated in state-of-the-art image writing for the restore function, all write and/or reading-lines must be charged individually through their own FETs. This is inefficient and requires large FETs.

The objective, therefore, arises of proposing a method for the restore function of write and read lines of a memory-cell array in which the charging current necessary for the restore function is brought together from all the restore devices.

This objective is realised in accordance with the invention by arranging that at least two of the write and/or read lines are connected to bring about an equalisation of potential between the write and/or read lines. To achieve this, means are provided for connecting at least two of the write and read lines during the restore phase.

In this way, all the restore-FETs which are connected to the different write and read lines contribute to the restore function and the current to be switched by the individual FETs is significantly reduced because the load is distributed over a larger number of devices.

By this means, the restore devices can be of smaller dimensions which means a considerable saving of space in the trigger circuitry of the SRAM-Array. The memory components can, therefore, be reduced further in size.

A further advantage of the solution in accordance with the invention is that, together with the smaller dimensions of the restore-devices, the parasitic capacity coupled to the write/read lines is also reduced. The smaller these parasitic capacities are, the more quickly can a change in charge and potential be effected-on a write/read line. The time required for writing to and reading from a memory cell is considerably reduced because the time which the corresponding signals require for their propagation is substantially shorter. In this manner, the basic cycle time can be further reduced.

A further advantage of the invention is that the bitswitches used to address the memory cells can be use in a manner not originally intended in order to perform the improved restore function. To bring this about, all bitswitches are simply made conductive during the restore-phase in order to achieve equi-potential bonding between all the lines.

A further advantage of the invention is that the de-coupling of the addressed bitlines from the datalines on activation of the reading amplifier can be carried out with very small hardware resources.

Figure 1:
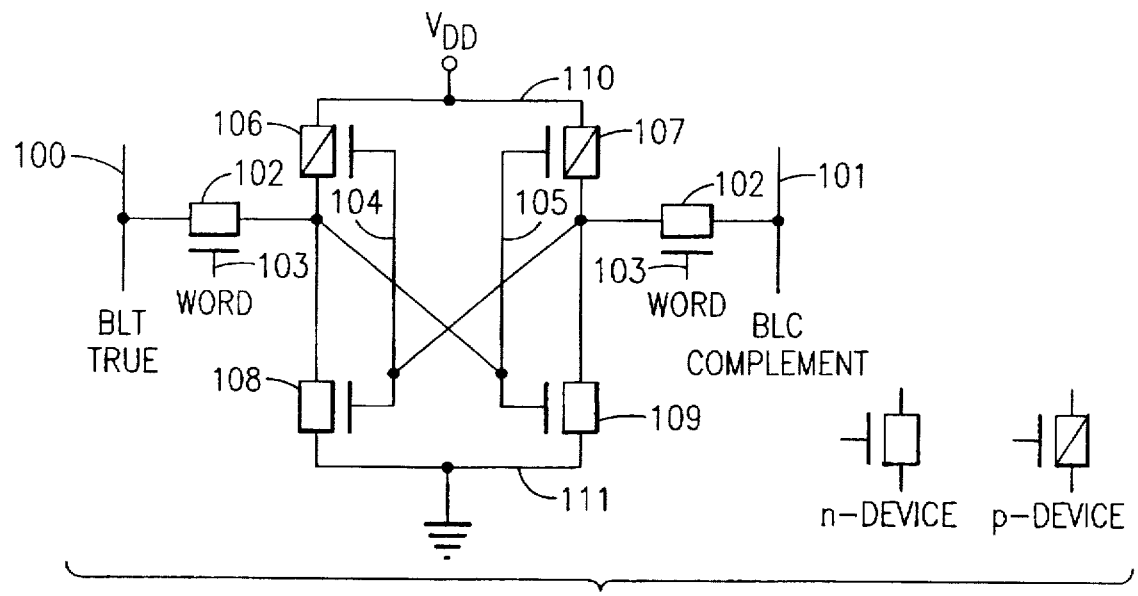
FIG. 1 shows the structure of a typical SRAM-memory cell consisting of 6 devices (4 n- and 2 p-devices).

FIG. 1 shows the circuitry of a memory cell consisting of six FETs, four n-FETs and two p-FETs. The actual flip-flop here consists of the devices 106, 107, 108, 109. This flip-flop is connected by the lines 104, 105 to the n-devices 102, at the gate-input of which (103) the wordline-signal is lying at any one time. If the corresponding wordline has been selected and the word-line signal has, therefore, been set to VDD, these devices (102) become conductive and create a connection between the line 105 and the true-bitline (100) as well as between the line 104 and the complement-bitline (101)

The following two different states of the flip-flop are possible: if the p-device 106 is conductive, the line 105 is at VDD potential, which means that the p-device 107 is blocked but that the n-device 109 on the other hand is conductive. In this way, the line 104 is set at GND. This has the effect that the p-device 106 continues to be conductive but that on the other hand the n-device 108 continues to be blocked. This state of the flip-flop, in which the line 105 lies on VDD and the line 104 on GND is switched through to the true-bitline (100) and the complement-bitline (101), if the corresponding row of memory-cells has been selected by a VDD-potential of the wordline (103).

The second state of the flip-flop is then adopted if the p-FET 106 blocks and the n-FET, on the other hand, conducts. This means that the line 105 and consequently the gates of the devices 107 and 109 also are at GND-potential. This results in p-FET 107 becoming conductive while the n-FET 109 is blocked. Signal line 104 therefore lies at VDD-potential, which is why the originally-assumed state (device 106 blocks, device 108 conducts) is maintained. If in this situation, the wordline (103) is activated, then a GND potential is switched to the true-bitline (101) while on the other hand, a VDD-potential is switched through to the complement-bitline (101).

Figure 2:
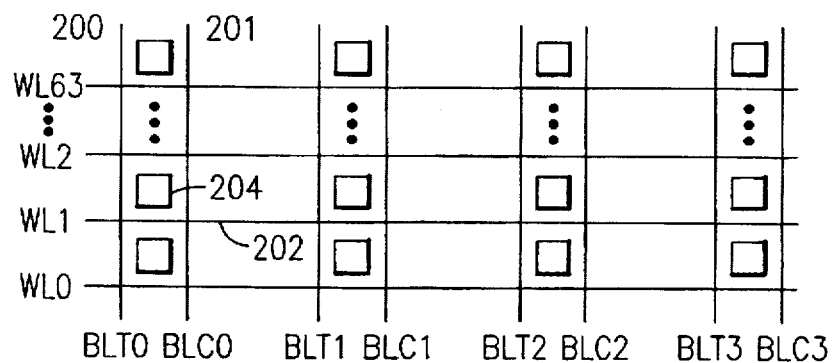
FIG. 2 shows how SRAM-memory cells are joined together in array.

In FIG. 2, shows an array of SRAM-cells. The selection of a particular SRAM-cell from this array is effected by determining the appropriate row by activating the wordline and the appropriate column by selecting the bitline pair consisting of the true- and complement-lines. For example, the SRAM-cell 204 is selected by setting the wordline WL1 (202) to VDD and the bitline pair BLO, consisting of the true bitline BLTO (200) and the complement-bitline (201), is read out.

Figure 3:
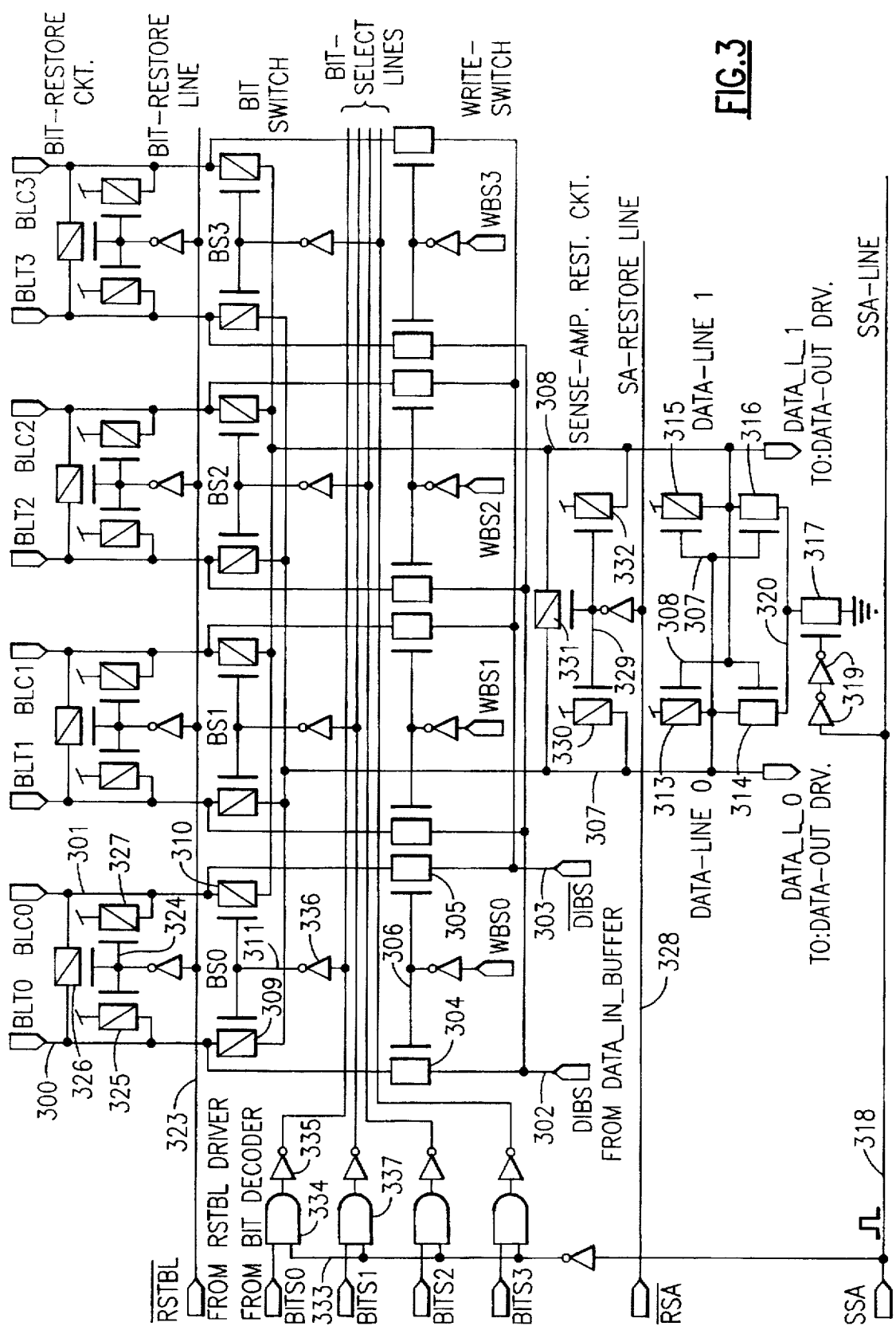
FIG. 3 illustrates a Read Write Restore circuit which can be used to write to and read from the S AM-memory cell in FIG. 1.

FIG. 3 shows a trigger circuit, by which a write or read access to the memory cells of the array is effected. The true bitline BLTO shown in FIG. 2 and the complement-bitline BLCO are also to be found in FIG. 3 (300, 301); the flip-flop itself and also the wordline have not been included in FIG. 3.

In order to provide write access to a SRAM-memory cell, one of the two bitlines of a bitline pair must be set to VDD and the other to GND. This occurs when the bitlines 300, 301 are connected to the data-in lines (302, 303) through the n-FETs 304, 305, the signal status of the data-in lines being dependent on the data supplied by the data-in buffer. In order to switch through the n-FETS (304, 305), a VDD-potential must be supplied to their gates (306). It can be seen from the circuit drawing that the connection necessary for the write access is then produced if the write bitswitch line WBS0 is set at GND-potential. If the write bitswitch line WBSO is connected to VDD, the write path is completely uncoupled from the bitlines (300, 301).

In a similar manner, a connection can be made between the bitlines (300, 301) and the read path. To this end, the true-bitline BLT0 (300) can be connected through the p-device 309 with the true-dataline 0 and, correspondingly, a connection can be made between the complement-bitline BLC0 (301) and the complement-dataline 1 (308) through the p-FET 310.

In order to make both devices 309, 310 conductive, it is necessary to set the signal BSO at gate 311 to GND. This will be achieved when the bitswitch-line BITS0 is switched from GND to VDD and the NAND gate passes a first inverter 335 and a second inverter 336. As a result of this triple inversion, a transfer of the two p-devices 309, 310 to GND at gate 311 takes place. In this way, a connection is made between the bitlines 300, 301 and the data lines 307, 308.

In this manner, a connection has now been made between the flip-flop in the memory-array which is to be read from and the datalines 307, 308. Initially, both datalines, the true-dataline (307) and the complement-dataline (308) find themselves at VDD-potential. The potential of that dataline which is connected to the bitline at GND-potential now begins to sink slowly in the GND-direction. In this respect, a potential difference exists between the true-dataline and (307) and the complement dataline (308).

The sense-amplifier now has the task of amplifying this potential difference and of generating a stable read out signal. This sense-amplifier consists of the four devices 313, 314, 315 and 316 and is activated by means of the signal line SSA. "Set sense-amplifier" (318) and the n-device 317. The n-device 317 then becomes conductive, if a VDD signal is present at its gate. In this respect, the SSA signal (318) must change from a GND-level to a VDD-level to activate the sense-amplifier. The two invertors 319, which are placed one behind the other in the circuit, merely have a delaying function. If the n-device 317 has now become conductive, the line 320 now lies at GND and the sense-amplifier begins to amplify any potential difference which exists between the true dataline (307) and the complement-dataline (308).

It may now be assumed that the true dataline (307) is connected through a p-device (309) with the bitline of the SRAM-cell finding itself at VDD, while the complement-dataline (308) is connected to the complement-bitline (301) through the p-device (310). After a memory cell has been selected by the corresponding wordline, the potential of the bitline (301) begins to drift slowly in the GND direction. After a certain time delay compared with the complement-bitline (301), the complement-dataline (308) also begins to drift in the GND direction. For this reason, at the time at which the signal SSA jumps to VDD and thereby activates the sense-amplifier, the potential of the complement-dataline (308) lies some 100 mv below VDD.

Because the potential VDD is present at the gate 307 of the two devices 315, 316, the n-device 316 is conductive while the p-device 316 is in blocking mode. In this respect, the complement-dataline (308) is drawn strongly in the direction of the earth potential GND through the FETs 316, 317. The further the potential on the line 308 drifts away, the more strongly the p-device 313 becomes conductive and the more strongly the n-device 314 exerts a blocking action. In this respect, the VDD-potential of the true-dataline (307) is substantially maintained.

The potential difference between the true-dataline (307), which remains substantially at VDD-potential and the markedly weakened complement-dataline (307) has, however, significantly increased and can be used to trigger the data-out driver.

Following every read or write access, the bitlines and the datalines must be returned to the initial potential VDD. This procedure, which attaches itself to the read or write access is called the restore procedure. The restore activity for the bitlines is carried out by the bit restore circuit which consists of the p-devices, 325, 326 and 327. When the signal restore-bitline (323) passes from GND to VDD, the signal 324 at the gates of the p-devices 325, 326 and 327 is set to GND, whereby the p-devices become conductive. This results on the one hand in both the true-bitline (300) being connected with VDD through the FET (325) and the complement-bitline (301) through the FET (327)—but also, on the other hand, a connection being made (and hence a charge equalisation effected) through the (now conductive) FET (326) between the true- and complement-bitlines.

This restore-circuit also results, on the one hand, in a re-charging of the bitlines to VDD and, on the other, in an equalisation of the potential of the two bitlines.

The sense-amplifier-restore-circuit, which consists of the p-devices 330, 331, and 332 operates on an analogue basis. If the RSA-signal, reset-sense-amplifier (328), passes from GND to VDD, the inverted RSA-signal (329) at the gates of the FETs (330–332) is at GND and all 3 p-devices become conductive. This means for one thing that both datalines are pulled towards VDD by the devices (330, 332) and for another, a charge-balancing between the two datalines takes place through the FET (331).

During the execution of the restore-procedure it is important that the restore-devices can perform the charging necessary for the equalisation-of-potential activity speedily. The shorter the time required for the restore function, the shorter can be the selected total cycle time so that higher clock frequencies are then possible. In this respect, the restore-devices must be designed for a relatively large current flow. The space required for a device, however, is highly dependent upon the magnitude of the current to be switched by the device. The shorter one might wish to make the cycle time, therefore, the greater become the necessary dimensions of the restore-devices. If, despite this, the space requirement is reduced, then the cycle time increases once again.

In order now to reduce the resource-investment required by the restore function, a switching circuit has been implemented in FIG. 3 which uncouples the bitlines (300, 301) from the datalines at that point in time at which a potential difference exists in the datalines 0 and 1 (307, 308) which is sufficiently large to ensure a reliable read out. This has the advantage that the sense-amplifier only amplifies the potential difference between the datalines. In this respect, one of the datalines is pulled towards the GND-potential but not, however, the associated bitline. This reduces the restore-contribution for regeneration of the VDD-potential of the bitline which has a reduced potential. Should one not wish to carry out this separation at the beginning of the read out procedure, then one of the bitlines of the sense-amplifier would also be pulled in the direction of GND potential and the corresponding amount of charge would have to be replaced during the restore procedure.

This uncoupling is to be carried out at the commencement of the read out procedure. The signal which the sense-amplifier activates. Set sense-amplifier (318), is also employed to bring about the uncoupling between the selected bitline-pair and the datalines.

In the switching circuit shown in FIG. 3, which corresponds to the state of the art, the SSA-signal (310) is inverted and fed to the relevant second inputs of the NAND-gates (334, 337, . . . etc), which have to pass through the bitswitch-lines BITS0–BITS3.

Figure 4:
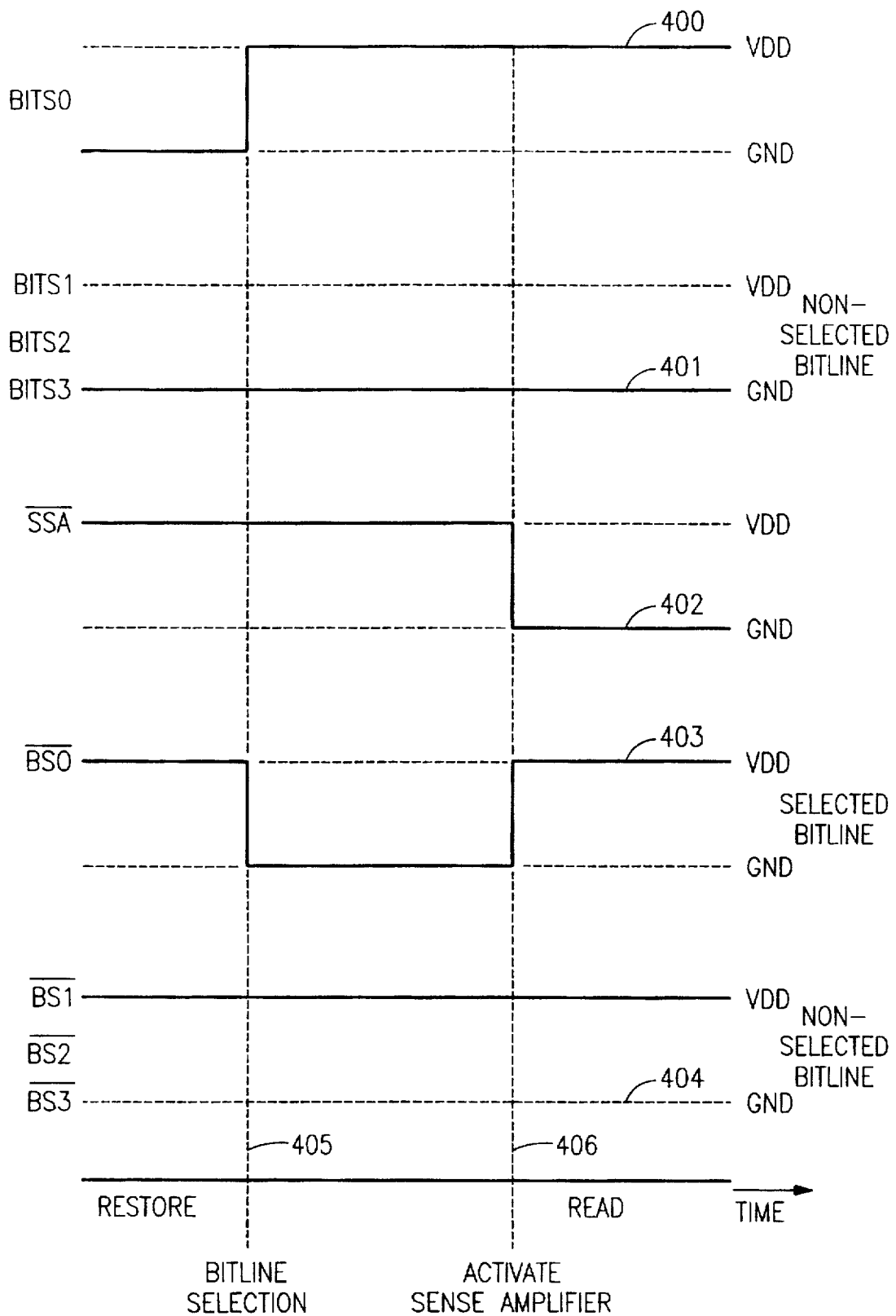
FIG. 4 shows the signal status of the bitswitch-lines over a period of time in the case of the positive selection procedure, where the bitswitch-lines for both the selected and the non-selected bitlines are illustrated.

The signal sequence brought about by this circuitry is illustrated in FIG. 4. The selection of the bitline-pairs to be read out (405) is carried out after the end of the restore-activity in such a manner that the associated bitswitch-line BITS0 is changed from GND to VDD. Assume that bitline pair 0 is to be selected. Then the line BITS 0 (400) is changed to VDD, while the other bitswitch lines BITS1, BITS 2, BITS 3 remain at GND (401). To activate the sense-amplifier (406) the signal SSA (318) is changed to VDD, the inverted signal SSA (333) consequently changes to GND (402). The signal (311), BS 0 which is at the gates of the p-devices (309, 310) therefore passes along the following signal sequence path: on selection of the bitline (405), it changes from VDD to GND (403). The bitswitch now conducts. However, with the negative flank of the inverted SSA-pulse, the signal (403) jumps back to VDD with activation of the sense-amplifier (406). The devices (309, 310) are now in a blocking mode and the bitlines (300, 301) are uncoupled from the datalines (307, 308). Since throughout the complete read out procedure, the bitswitch-lines BITS 1, BITS 2, BITS 3 (401) remain at GND, (and) the corresponding signal lines BS 1, BS 2, BS 3 (404) attached to the p-devices of the bitswitches remain at VDD, the corresponding devices are, consequently, in blocked mode.

In the methods described previously, the switch associated with the selected bitline is switched through to commence the read out procedure and reset on activating the sense-amplifier (403). In this situation, one talks of a positive selection procedure; the selected bitswitch is turned on and off again.

During the restore-procedure, all the devices which are associated with the bitswitches are in blocked mode. During the restore-procedure, therefore, all the datalines (307, 308) are uncoupled from all the bitline-pairs. This has the consequence that the restore activity for each bitline pair and for the pair of datalines must be carried out separately. A worst-case study clearly reveals which function the restore-device must be able to supply in order, within the prescribed restore time, on the one hand to charge all bitlines and datalines to VDD and on the other hand, to produce the relevant equalisation of charge between the true- and the complement-lines. A write access to a bitline pair, e.g. to the bitline pair 0, should be considered as the worst case in respect of the discharge of bit and data lines. To that end, the write bitswitch 0 is conductive and either the true or the complement bitline (300, 301) is pulled completely to GND potential through one of the data-in bitswitch-lines (302, 303). Since there is a simultaneous read access on this bitline pair 0 and the read bitswitch, consisting of the devices (309, 310) is also switched through, the datalines (307, 308) are connected with the bitline-pair 0. Since one of the bitlines now remains at GND and since the sense-amplifier continues to amplify an existing potential difference, one of the datalines—either the true (307) or the complement (308) dataline—changes fully to GND. The bitline-pairs 1–3 are not selected to the extent that their bitswitches also are not in conductive mode but nevertheless at any one time a bitline of the relevant pair from its allocated memory cell is pulled by some 100 mv in the direction of GND.

Compensation for all these potential changes must now be provided in the restore procedure. Since with a positive selection procedure all bitswitches are de-activated during the restore-procedure, each restore-device must be capable in its own right of re-charging the associated lines. Therefore, the bit-restore-circuit assigned to a small pair must be capable of charging a bitline from GND to VDD during the restore-cycle-period. Similarly, the sense-amplifier-restore-circuit must be capable of bringing a dataline which is at GND potential to VDD potential within the given time.

This is, however, inefficient in that each restore-circuit must in its own right be capable of charging one line from GND to VDD within the given time. The other restore-circuits, where the lines had not been reduced to GND, are not fully utilised during the restore-procedure.

Moreover, it is necessary to design the restore-devices for such a large current flow that they must be of large dimensions. Efforts to further miniaturise the SRAM-array are hindered in a lasting manner by the high current values required by the restore-devices. A further disadvantage arises from the large restore-devices: the restore-devices (325, 327 or 330, 332) act as parasitic capacitors on both the bitlines and on the datalines and thereby slow down the flow of the charge from the memory cells through the bitline to the dataline by a considerable extent. If the restore-devices were to be made smaller, these parasitic capacitors would also reduce in extent (and) the recharging procedure would be accelerated accordingly. In this way the cycle times could be further reduced.

The object of the proposal in accordance with the invention is to make possible co-operation between the different restore devices assigned to the different bitlines and datalines in such a way that the recharging current is more uniformly distributed between the devices present. In this way, on the one hand the cycle time can be reduced and on the other hand the strength of current to be switched by each device is reduced so that the devices can be made smaller. In that respect, the space required by the memory-cell arrays is reduced. Furthermore, smaller restore-devices have smaller capacitances so that the parasitic capacitor effects on the bitlines as well as on the datalines are considerably reduced, resulting in a faster flow of charge from the memory cell through the bitlines to the datalines. Even for the write procedure, the smaller parasitic capacitor effects have the consequence that the GND potential of the data-in line can be transferred more quickly to the memory-cell which is to be written to.

The solution provided in accordance with the invention consists of switching all bitswitches to pass-through mode during the restore procedure so that the substitution charge can be delivered by all the devices in concert and simultaneously.

Figure 6:
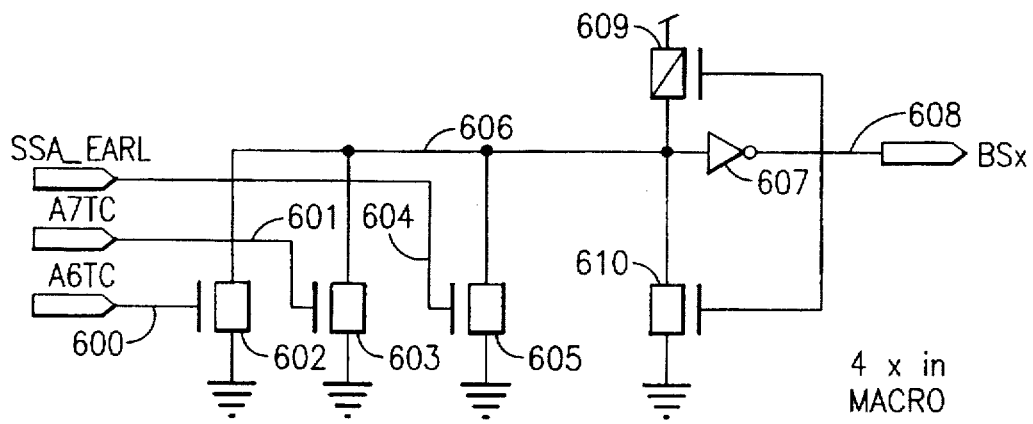
FIG. 6 illustrates a circuit by means of which the bitswitches in FIG. 5 can be correspondingly selected for a negative selection procedure.
Figure 5:
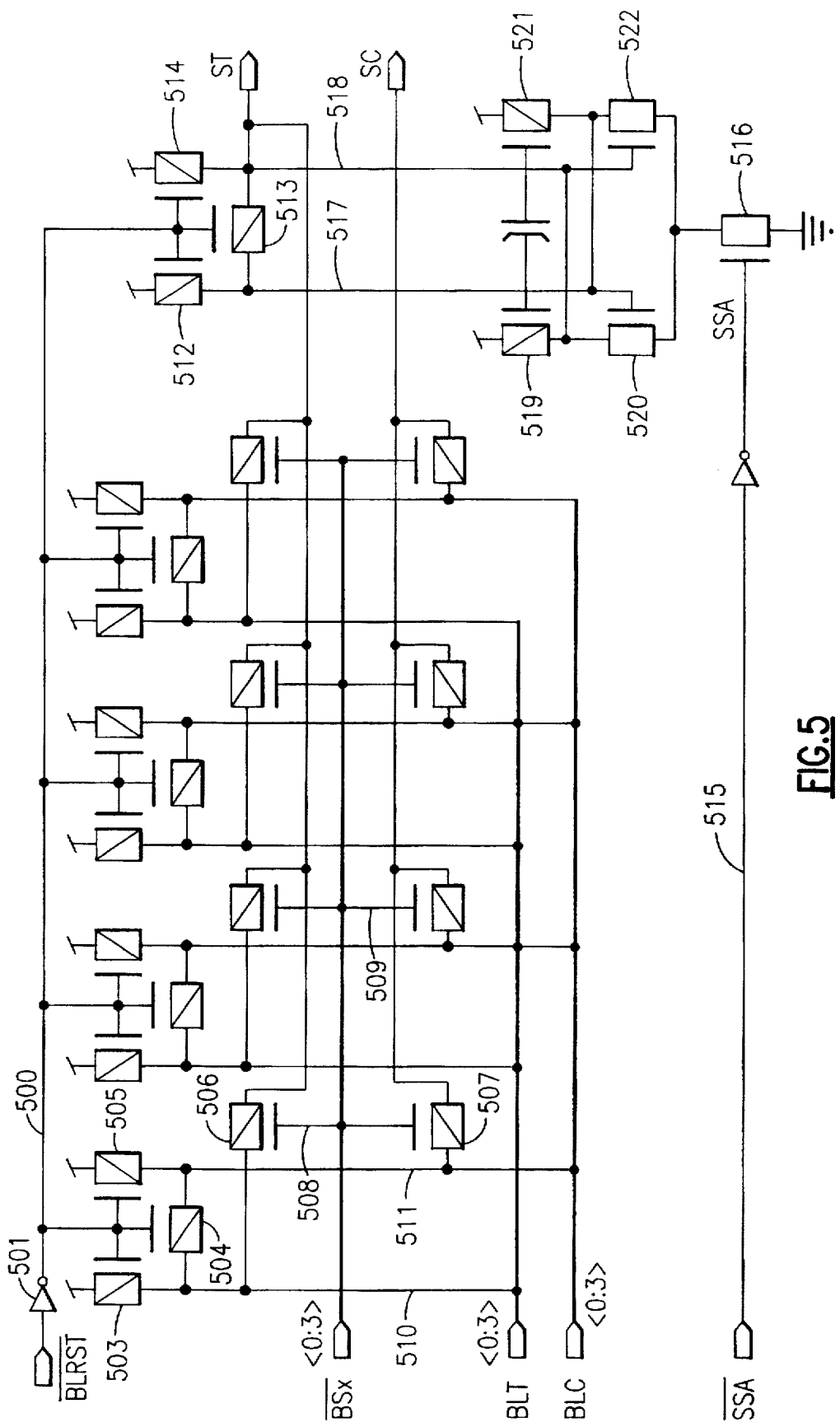
FIG. 5 illustrates modified trigger circuitry for SRAM-memory cells, where, however, only the read and restore paths are present.

The switching circuits which are necessary for the realisation of such a restore method are illustrated in FIGS. 5 and 6. FIG. 5 shows the switching elements necessary for read out and for the restore of memory-cells once again in an arrangement which is a slight amendment compared with FIG. 3. The true (510) and the complement bitline (511) of the bitline-pair 0 can be switched through to the true (517) and complement (518) datalines through the devices (506, 507) of the bitswitches 0. The triggering of these bitswitches is achieved by the signal lines BS 0 to BS 3 which lie at the gates (508, 509, etc . . . ) of the bitswitch devices. If these gates are at GND potential they will be conductive, otherwise they will be in blocked mode. Each of the four bitline pairs is connected with a column of memory cells.

To read out the datalines a sense-amplifier is once again provided which amplifies any potential difference which may be present. This sense-amplifier consists of the devices (519, 520, 521, and 522); the activation of these devices is provided by the n-device (516). This n-device becomes conductive if the signal at its gate changes over from GND to VDD. This is the case if the SSA signal 515 changes over from VDD to GND.

In the restore phase, the restore of the bitlines as well as the restore of the datalines is initiated by a common signal BLRST. If this signal assumes the VDD level, the signal 501 inverted by the invertor 501 changes over to GND level which switches the bitline restore devices of all 4 bitline pairs as well as the restore devices of the dataline pairs into the conductive state.

In this manner, for example, the bitline pair 1 is connected to VDD through the devices 503, 505 (and) the device 504 provides for a balancing of charge between the true and the complement bitlines (510, 511). Similar events take place with the other bitline pairs and the datalines.

In FIG. 6, a triggering circuit for the bitswitches 0 to 3 is shown, by which the restore function in accordance with the invention can be realised. The switch circuitry shown in FIG. 6 must be present once for each of the bitswitch lines BS0, BS1, BS2 and BS3. By means of the n-devices 602, 603 and 605 the GND potential can be switched through to the signal line 606. This takes place, if any one of the gate-signals 600, 601, 604 are set at VDD potential. In this respect, an OR connection of the signal SSA_EARL and the address signals A6TC and A7TC is made by the indicated circuit; if any one of these signals is at VDD, the line 606 is pulled to GND. This signal 606 is inverted by the invertor 607 and the resulting signal 608 is one of the signals BS0 to BS3 and can be used directly to trigger the switching circuitry shown in FIG. 5. The condition of signal 608 couples back on the p-device 608 and the n-device 609 at the gate-electrodes of which it lies. If signal 608 lies at VDD signal 606 is connected with GND through the—now conductive—device 610; if signal 608 is at GND, then the device 609 becomes conductive signal 606 is at VDD.

With the assistance of this switching circuitry in accordance with the invention a negative selection procedure for the bitswitches can now be implemented, as a result of which all bitswitches are active during the restore-procedure and when there is a changeover to write/read procedure, the non-selected bitlines are switched off (negative selection). By means of the one bitswitch remaining open, the write/read access takes place in the array and when a read out pulse is initiated, this switch also is deactivated.

Figure 7:
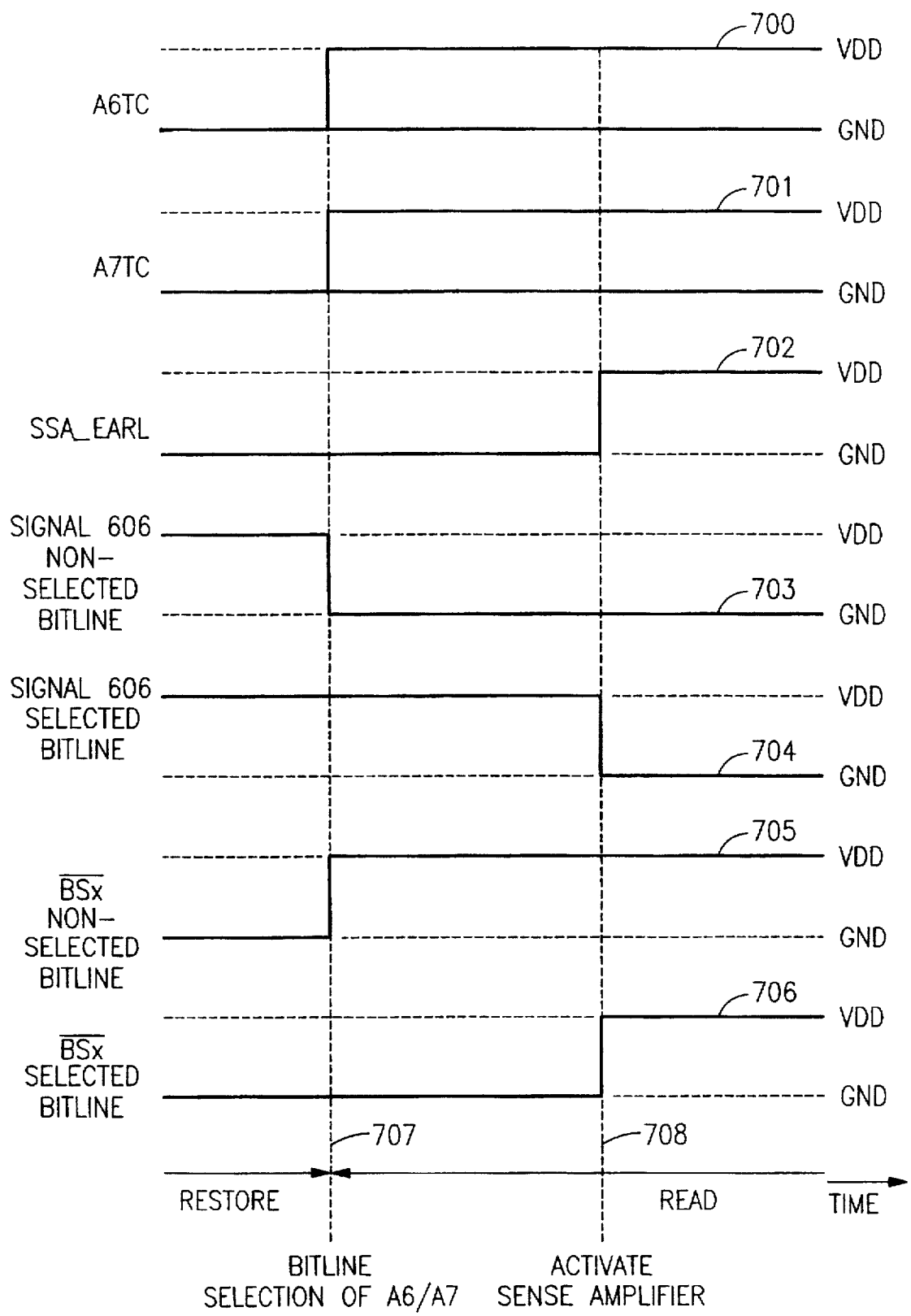
FIG. 7 depicts the signal status of the bitswitch lines over a period of time for the case of negative selection procedure, where the bitswitch-lines for both the selected and the non-selected bitlines are represented.

FIG.7 illustrates this flow of signals under the negative selection procedure. Each of the four macro-initiated switch circuits as shown in FIG. 6 triggers a bitswitch line BS0 . . . BS3. Dependent upon which of the four bitswitches is involved, either the true or the complement line from address bit 7 and the true or complement line from address bit 7 is connected with the gates of the FETs 602 and 603. The four different possible combinations 6C/7C, 6C/7T, 6T/7C, 6T/7T determine the switching pattern of the four circuits. The signal of the two A6 and A7 related address-lines are indicated in 700 and 701. In the course of the restore-procedure both address lines are at GND and only when the bitline is selected by A6/A7 (707) are the signals set. When the addressing occurs, the corresponding potential differences build up on the datalines. After a certain time, the signal SSA_EARL(702) is set, activating the sense-amplifier.

The three devices 602, 603 and 605 now carry out a connection of the awaiting signals. If signal 600 or signal 601 is at VDD, the signal 606 changes to GND. The signal flow of 606 is shown in FIG.7 both for the situation where the bitswitch-line for which the circuit is responsible has been addressed (704, selected bitline) and also for the situation where it has not been selected (703), non-selected bitline).

In the case of the selected bitline, both address-lines (700, 701) must have been set to GND between the time points 707 and 708 since, because in this region SSA_EARL (702) also remains at GND, GND will not have been switched through on signal 606 (704) between 707 and 708 signal 606 remains at VDD. If on the other hand, one of the address lines lies at VDD, the signal-line 606 will be pulled immediately to GND (703) with initiation of the address selection 707.

The inverted signal 606 from the invertor 607 can now be used immediately to trigger the bitswitches in FIG. 5. The bitswitch-devices 506, 507 etc. in FIG. 5 are p-devices, which become conductive when GND is applied to them.

It can thus be seen that the signals BSx (705, 706) can effect a negative selection procedure. During the restore activity all bitswitches are conductive because all BSx signals are at GND. After the address selection has taken place only the selected bitswitch (706) remains conductive; all the others are switched off. With the initiation of the SSA-pulse even the one bitswitch remaining conductive is then blocked.

In this respect a negative bitswitch-selection procedure can be achieved using the circuitry illustrated in FIG. 6. During the restore-procedure the bitswitches are used to couple all the bitlines and datalines and subsequently, to connect the correct bitline-pair with the datalines.

It is particularly important that the de-activation of the last bitswitch achieved by the extensive utilisation of hardware shown in FIG. 3 can now be effected in a simple manner with the device 605 in FIG. 6. The negative selection system therefore also offers advantages in terms of hardware requirements.

Figure 8A:
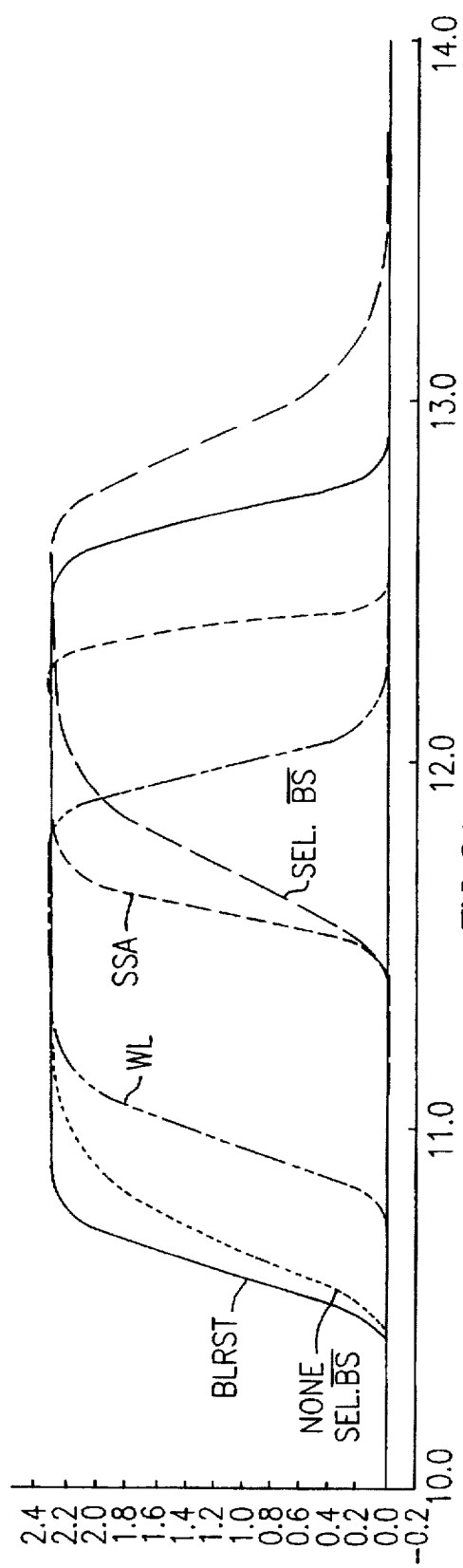
FIG. 8 shows the flow-sequence over a period of time of the relevant signals for a read from access to a SRAM-cell.
Figure 8B:
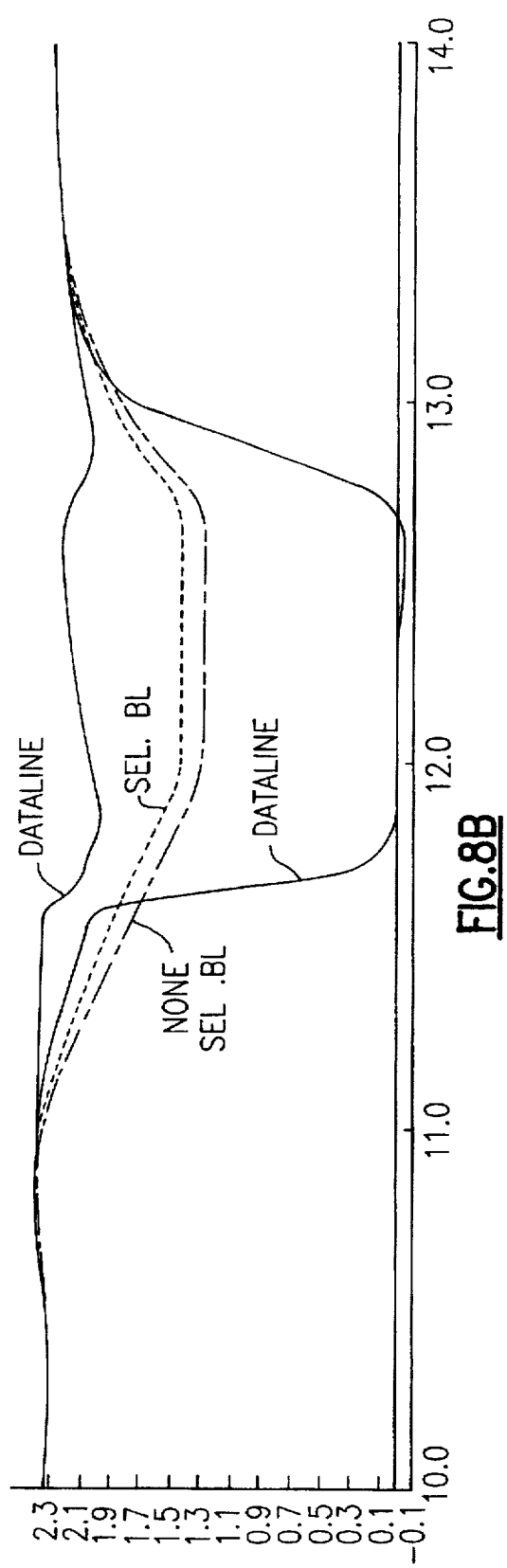

FIG. 8 shows a signal diagram for the situation involving read access to a memory cell. By means of the signal 'non-select.BS' all the bitswitches except one can be switched off shortly after the completion of the restore-procedure shortly after the SSA-pulse even the remaining bitswitch is switched off ('sel.BS').

The lower half of the diagram illustrates the signal flow through the bit- and datalines.

Figure 9A:
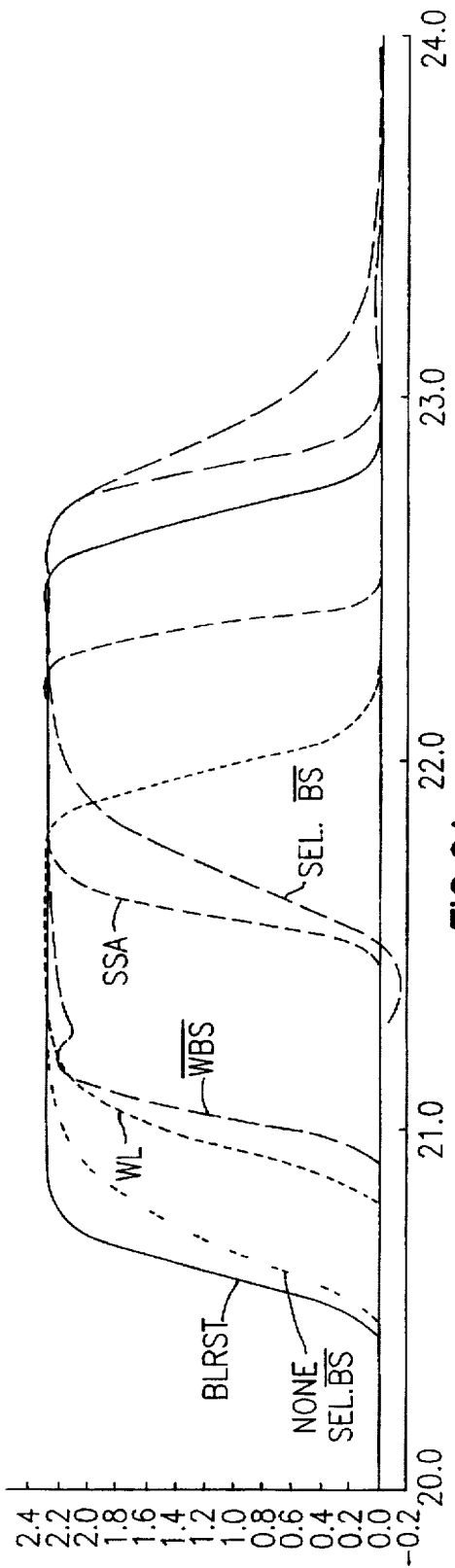
FIG. 9 depicts the flow-sequence over a period of time of the relevant signals for a write access to a SRAM-cell when there is a simultaneous write and read access to the same cell (write through).
Figure 9B:
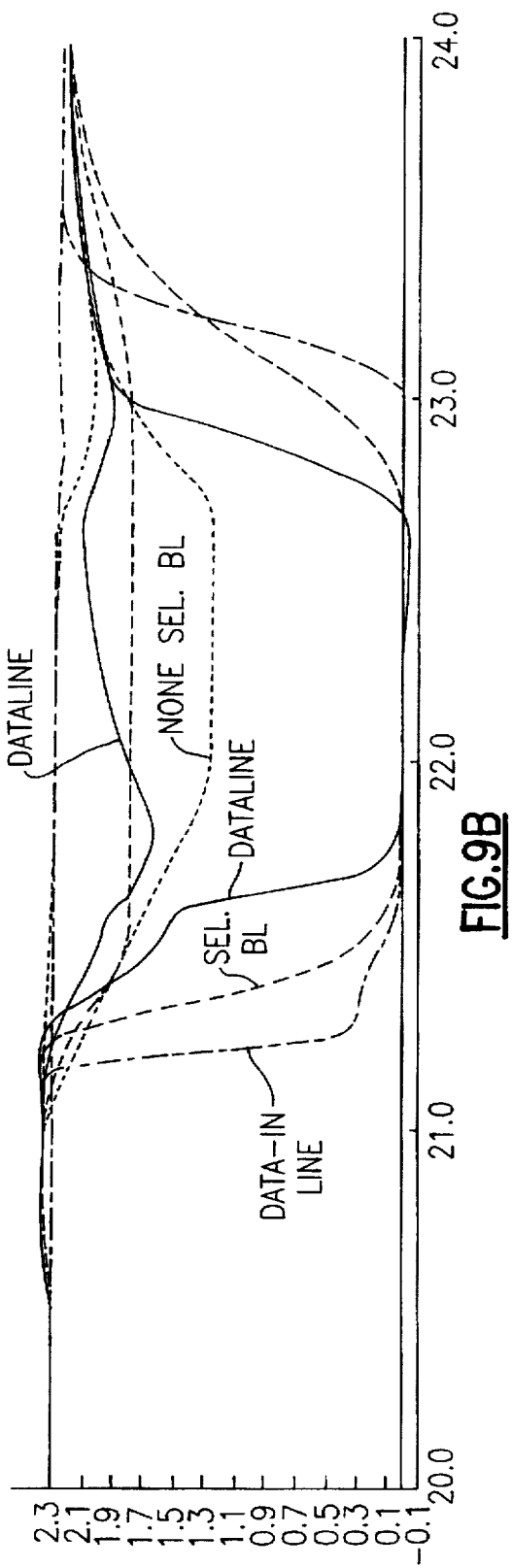

FIG. 9 illustrates the signal flow for the 'write through' situation. Here, therefore, one and the same memory-cell is written to and read in the same cycle.

Once again, the non-addressed bitswitches are switched off first ('not-sel. BS') and then the selected ones following the SSA-pulse. As distinct from FIG. 8, however, here the write bitswitch is also activated (signal WBS).

In the lower part it can be seen that one of the selected bitlines does not connect with GND because it is connected with the write path through its conductive bitswitch. Consequently, this illustrates the "worst-case" scenario for the restore-procedure.

We claim:

1. Apparatus for writing to and reading from an array of memory cells arranged in columns of memory cells, comprising, a read/write restore circuit for each column of memory cells, having a sense amplifier and a bitline pair for writing to and reading from any of the memory cells in said column, and bitswitch means which are conductive during a restore phase, and precharge devices for bringing each said bitline pair to an initial potential (VDD) during a precharge phase, whereby all different bitline pairs belonging to one sense amplifier are connected together during a restore phase in which a charge is supplied by the precharge devices during a restore, and equilibration means connecting the bitlines of at least two bitline pairs during said precharge phase and opening all bit switches during the precharge phase.

2. Apparatus for writing to and reading from an array of memory cells according to claim 1, wherein each of the bitline pairs comprises a true-bitline and a complement-bitline.

3. Apparatus for writing to and reading from an array of memory cells according to claim 2, wherein a dataline pair corresponds to a set of bitline pairs, and said bitswitch means which are conductive during the restore phase selectively connect a subset of the corresponding bitline pairs to said dataline pair.

4. Apparatus for writing to and reading from an array of memory cells according to claim 3, wherein said dataline pair comprises a true-dataline and a complement-dataline.

5. Apparatus for writing to and reading from an array of memory cells according to claim 4, wherein sense amplifying means are connected to the dataline pair for amplifying a voltage difference between the datalines during a read phase.

6. Apparatus for writing to and reading from an array of memory cells according to claim 3, wherein said equilibration means activate said bitswitch means during said precharge phase in order to connect all the bitline pairs of said set to the dataline pair.

7. A method for precharging bitline pairs in an array of memory cells arranged in columns of memory cells, with, for each column of memory cells, a bitline pair for writing to and reading from any of the memory cells in the column, and precharge devices for bringing the bitline pairs to an initial potential (VDD) during a precharge phase, comprising:

using said precharge devices to bring the bitline pairs to an initial potential (VDD) during a precharge phase, and during said precharge phase connecting the bitlines of at least two bitline pairs.

8. A method for precharging bitline pairs according to claim 7, wherein said array memory cells has a dataline pair corresponding to a set of bitline pairs, and bitswitch means are provided enabling selectively connecting a subset of the corresponding bitline pairs to the dataline pair, and said method further includes activating said bitswitch means during said precharge phase for connecting all bitline pairs of said subset of the corresponding bitline pairs to the dataline pair.

* * * * *